US012564031B2

(12) United States Patent
Tang et al.

(10) Patent No.: US 12,564,031 B2
(45) Date of Patent: Feb. 24, 2026

(54) SEMICONDUCTOR DEVICE AND METHOD FOR MANUFACTURING SAME

(71) Applicant: YANGTZE MEMORY TECHNOLOGIES CO., LTD., Wuhan (CN)

(72) Inventors: Zhaohui Tang, Wuhan (CN); Lei Zhang, Wuhan (CN); Yuting Zhou, Wuhan (CN); Si Qiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 459 days.

(21) Appl. No.: 18/083,927

(22) Filed: Dec. 19, 2022

(65) Prior Publication Data

US 2023/0121962 A1 Apr. 20, 2023

Related U.S. Application Data

(63) Continuation of application No. PCT/CN2021/127498, filed on Oct. 29, 2021.

(30) Foreign Application Priority Data

Nov. 3, 2020 (CN) .......................... 202011208819.9

(51) Int. Cl.
*H01L 21/768* (2006.01)
*H01L 21/02* (2006.01)
(Continued)

(52) U.S. Cl.
CPC .... *H01L 21/76819* (2013.01); *H01L 21/0214* (2013.01); *H01L 21/02178* (2013.01);
(Continued)

(58) Field of Classification Search
CPC ........... H01L 21/76819; H01L 21/0214; H01L 21/02178; H01L 21/02186; H01L 23/5226;
(Continued)

(56) References Cited

U.S. PATENT DOCUMENTS 9,449,987 B1 9/2016 Miyata et al.
2016/0329340 A1 11/2016 Hwang et al.
(Continued)

FOREIGN PATENT DOCUMENTS

CN 107305893 A 10/2017
CN 107564913 A 1/2018
(Continued)

OTHER PUBLICATIONS

Translation of CN 109920791 (Year: 2025).*
(Continued)

*Primary Examiner* — Richard A Booth
(74) *Attorney, Agent, or Firm* — BAYES PLLC

(57) ABSTRACT

A method for manufacturing a semiconductor device is provided. The method includes the following. A substrate is provided. A stacked structure is formed on the substrate. The stacked structure includes first material layers and gate layers that are alternatively stacked. The stacked structure includes a giant block (GB) region and a stair-step region. A third material layer is formed on an upper surface of the GB region and an upper surface of the stair-step region. A fourth material layer filling the stair-step region and covering the GB region is formed. At least one contact structure is located in the stair-step region. Each of the at least one contact structure penetrates the third material layer and is connected with a respective one of the gate layers.

20 Claims, 9 Drawing Sheets

1010

(51) Int. Cl.

| | | |
|---|---|---|
| *H01L 23/522* | (2006.01) |
| *H01L 23/528* | (2006.01) |
| *H10B 41/20* | (2023.01) |
| *H10B 41/35* | (2023.01) |
| *H10B 43/20* | (2023.01) |
| *H10B 43/35* | (2023.01) |
| *H10D 30/01* | (2025.01) |
| *H10D 30/68* | (2025.01) |
| *H10D 30/69* | (2025.01) |
| *H10D 64/01* | (2025.01) |

(52) U.S. Cl.
CPC .... *H01L 21/02186* (2013.01); *H01L 23/5226* (2013.01); *H01L 23/5283* (2013.01); *H10B 41/20* (2023.02); *H10B 43/20* (2023.02); *H10D 30/0411* (2025.01); *H10D 30/0413* (2025.01); *H10D 30/68* (2025.01); *H10D 30/6891* (2025.01); *H10D 30/69* (2025.01); *H10D 30/694* (2025.01); *H10D 64/017* (2025.01); *H10D 64/035* (2025.01); *H10D 64/037* (2025.01); *H10B 41/35* (2023.02); *H10B 43/35* (2023.02)

(58) Field of Classification Search
CPC ..... H01L 23/5283; H10B 43/20; H10B 41/20; H10D 30/0411; H10D 30/69; H10D 64/037; H10D 64/017; H10D 30/68; H10D 64/035; H10D 30/6891; H10D 30/0413; H10D 30/694

See application file for complete search history.

(56) References Cited

U.S. PATENT DOCUMENTS

| | | |
|---|---|---|
| 2017/0271354 A1 | 9/2017 | Kwak |
| 2019/0326166 A1 | 10/2019 | Nam et al. |

FOREIGN PATENT DOCUMENTS

| | | |
|---|---|---|
| CN | 107564916 A | 1/2018 |
| CN | 107706183 A | 2/2018 |
| CN | 107706187 A | 2/2018 |
| CN | 107808884 A | 3/2018 |
| CN | 108630694 A | 10/2018 |
| CN | 109065547 A | 12/2018 |
| CN | 109216366 A | 1/2019 |
| CN | 109411478 A | 3/2019 |
| CN | 109686741 A | 4/2019 |
| CN | 109920791 A | 6/2019 |
| CN | 110277408 A | 9/2019 |
| CN | 110729296 A | 1/2020 |
| CN | 111199976 A | 5/2020 |
| CN | 111564445 A | 8/2020 |
| CN | 111769120 A | 10/2020 |
| CN | 112331661 A | 2/2021 |

OTHER PUBLICATIONS

First Office action issued in corresponding Chinese Application No. 202011208819.9, mailed on May 13, 2021, 6 pages.
International Search Report issued in corresponding International Application No. PCT/CN2021/127498, mailed on Jan. 26, 2022, 4 pages.
Second Office action issued in corresponding Chinese Application No. 202011208819.9, mailed on Jul. 22, 2021, 4 pages.
Written Opinion issued in corresponding International Application No. PCT/CN2021/127498, mailed on Jan. 26, 2022, 4 pages.

* cited by examiner

Silicon nitride hard mask

Silicon nitride hard mask

900

1000

1010

SEMICONDUCTOR DEVICE AND METHOD FOR MANUFACTURING SAME

CROSS-REFERENCE TO RELATED APPLICATIONS

This application is a continuation of International Application No. PCT/CN2021/127498 filed on Oct. 29, 2021, which claims the benefit of priority to Chinese application No. 202011208819.9 filed on Nov. 3, 2020, the entire contents of which are hereby incorporated by reference in their entireties.

BACKGROUND

Since emerging, semiconductor integrated circuits have gone through the development stages of small-scale, medium-scale, large-scale, and very-large-scale integration, and increasingly become one of the most active fields of technology in modern science and technology.

Memory is a widely used semiconductor device. To overcome the limitations of conventional two-dimensional memory in terms of storage capacity, modern processes often use stacked memory chips to achieve higher degrees of integration. For example, chips or structures with different functions may be formed into a three-dimensional (3D) device with three-dimensional integration and signal connectivity in a vertical direction by using micromachining techniques such as stacking and hole interconnection. In a 3D memory, such techniques are used to arrange memory cells in three dimensions on a substrate, thereby improving memory performance and storage density.

SUMMARY

Embodiments of the disclosure relate to a method for manufacturing a semiconductor device.

Embodiments of the disclosure provide a method for manufacturing a semiconductor device, including: providing a semiconductor substrate; forming a stacked structure on the substrate, where the stacked structure includes first material layers and gate layers that are alternately stacked, and includes a giant block (GB) region and a stair-step region; forming a third material layer on an upper surface of the stair-step region; forming at least one contact structure in the stair-step region, where each of the at least one contact structure penetrates the third material layer and is connected with a respective one of the gate layers.

Another aspect of the disclosure provides a semiconductor device, including: a substrate; a stacked structure on the substrate, where the stacked structure includes first material layers and gate layers that are alternatively stacked, and includes a giant block (GB) region and a stair-step region; a third material layer covering an upper surface of the stair-step region; and at least one contact structure in the stair-step region, wherein each of the at least one contact structure penetrates the third material layer and is connected with a respective one of the gate layers.

BRIEF DESCRIPTION OF THE DRAWINGS

One or more embodiments are exemplarily described by using diagrams corresponding thereto in the accompanying drawings. Unless specifically indicated, the diagrams in the accompanying drawings do not constitute any proportion limitation.

DETAILED DESCRIPTION

Figure 1:
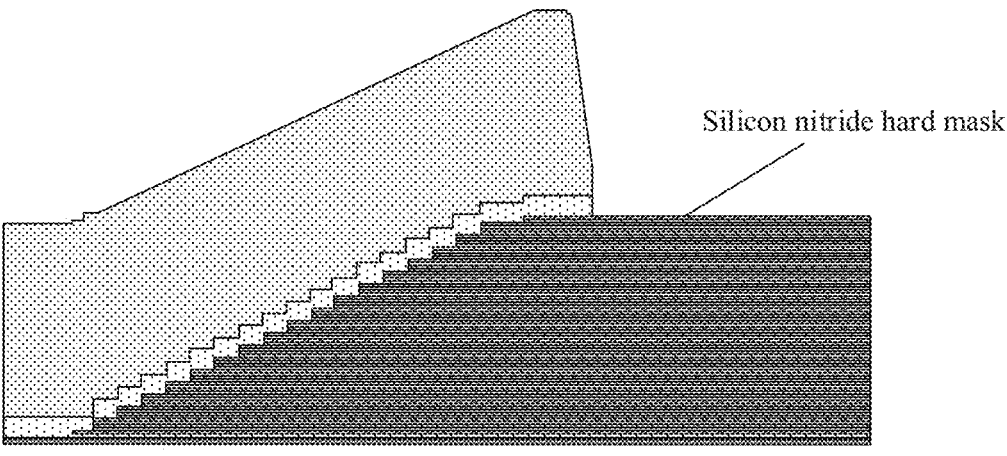
FIG. 1 and FIG. 2 illustrate schematic diagrams of a method for manufacturing a semiconductor device.

To describe the technical solutions of the embodiments of the disclosure more clearly, the following briefly describes the accompanying. Apparently, the accompanying drawings in the following description show only some examples or embodiments of the disclosure, and a person of ordinary skill in the art may still apply the disclosure to other similar scenarios according to these accompanying drawings without creative efforts. Unless otherwise indicated, the same signs in the drawings represent the same structures or operations.

In the following descriptions, details are described to make the disclosure comprehensible. However, the disclosure may be implemented in other manners different from those described herein. Therefore, the disclosure is not limited to specific embodiments disclosed below.

As shown in the disclosure and claims, unless the context clearly suggests an exception, the words "a," "one," "an," and/or "the" do not refer specifically to singular, but may also include plural. Generally, the terms "include" and "comprise" suggest the inclusion of clearly identified operations and elements that do not constitute an exclusive list, and the method or device may also include other operations or elements.

Unless specifically stated otherwise, the relative arrangements, numerical expressions, and values of the components and operations set forth in these embodiments do not limit the scope of the disclosure. In addition, for ease of description, the dimensions of the various parts shown in the drawings are not drawn in accordance with actual scale relationships. Techniques, methods, and apparatuses known to those of ordinary skill in the related art may not be discussed in detail, but the techniques, methods, and apparatuses should be considered as part of the authorized specification if appropriate. In all examples shown and discussed herein, any specific value should be interpreted to be illustrative but not restrictive. Therefore, other examples may have different values. It should be noted that similar signs and letters indicate similar items in the accompanying drawings below, so that once an item is defined in one accompanying drawing, the item does not need to be further discussed in the subsequent accompanying drawings.

When the embodiments of the disclosure are described in detail, for ease of description, the cross-sectional views representing the device structure are not partially enlarged in accordance with the general scale, and the schematic diagrams are only examples, which should not limit the scope of protection of the disclosure herein. In addition, three-dimensional spatial dimensions of the length, width, and depth should be included in actual production.

In the description of the disclosure, orientation or location relationships indicated by orientation terms such as "front, rear, up, down, left, and right", "transverse, longitudinal, vertical, and horizontal", and "top and bottom" are usually based on orientation or location relationships shown in the accompanying drawings, and are only used to facilitate and simplify the description of the disclosure. Unless otherwise indicated, these terms are not used to indicate or imply that the apparatuses or elements must have specific orientations or are constructed and operated with specific orientations, and therefore cannot be understood as a limit to the scope of protection of the disclosure. The orientation terms "inside and outside" refer to the inside and outside relative to the contour of each part itself.

For ease of description, spatial relationship terms such as "below," "under," "lower than," "underneath," "above," and "on" may be used herein to describe the relationship between one element or feature shown in the accompanying drawings and other elements or features. These spatial relationship words are intended to encompass directions of the device in use or operation other than those depicted in the accompanying drawings. For example, if the device in the accompanying drawing is inverted, the orientation of the element described as "below," "under," or "underneath" another element or feature will be changed to "above" the another element or feature. Therefore, the exemplary words "below" and "under" can include both up and down directions. The device may also have other orientations (rotated by 90 degrees or in other directions), so the spatial relationship descriptors used here should be interpreted accordingly. In addition, when a layer is referred to as being "between" two layers, it can be the only layer between the two layers, or there may be one or more layers therebetween.

In the context of the disclosure, the described structure with the first feature "on" the second feature may include embodiments in which the first and second features are formed in direct contact, or may include embodiments in which additional features are formed between the first and second features, such that the first and second features may not be in direct contact.

It should be understood that when a part is referred to as "on another part," "connected to another part," "coupled to another part," or "touching another part," it may be directly on top of, connected to, coupled to, or touching the another part, or there may be an inserted part. In contrast, when a part is referred to as "directly on another part," "directly connected to," "directly coupled to," or "directly touching" another part, there is no inserted part.

In addition, it should be noted that the use of words such as "first" and "second" to limit the parts are only used to facilitate the differentiation between the corresponding parts, and unless otherwise stated, the above words have no special meanings and therefore cannot be interpreted as a limitation of the scope of protection of the disclosure. In addition, although the terms used in the disclosure are chosen from those in common public knowledge, some of the terms referred to in the specification of the disclosure may have been chosen by the applicant at his or her discretion, and their detailed meanings are described in the related parts of the description herein. In addition, it is required that the disclosure is understood not only by the actual terms used, but also by the meaning implied by each term.

During the manufacturing of a semiconductor device (for example, 3D NAND), to ensure that contact structures can be connected to gate lines in respective layers in a core region, a stair-step structure usually needs to be formed, and an Array Planarization (APL) process is introduced. As the number of layers in the 3D NAND increases, oxide filling stair steps become thicker, the grinding time of APL increases. Additionally, changes may be produced to the layers in the previous process. Thus, a series of overpolishing or underpolishing problems may be caused.

Figure 2:
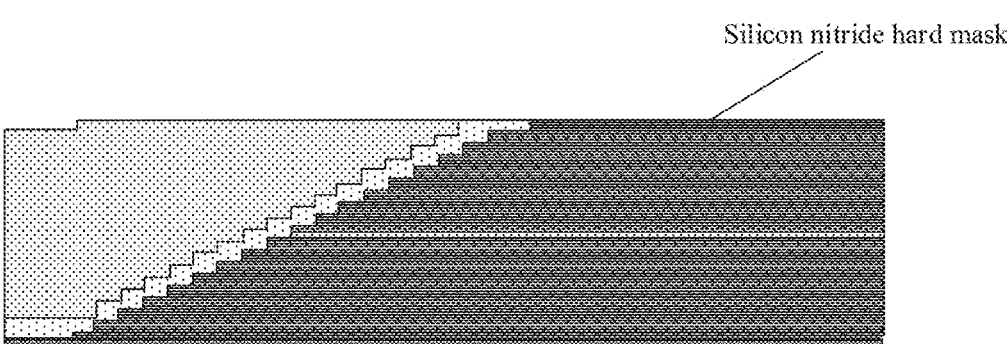

FIG. 1 and FIG. 2 illustrate schematic diagrams of a method for manufacturing a semiconductor device. Referring to FIG. 1 and FIG. 2, for a multilayer (for example, 128 layers) semiconductor structure, one method is to use a silicon nitride (SiN) hard mask as a stop layer during APL. However, due to differences in etch loading between positions such as edges of a giant block (GB) region of a semiconductor structure in a chemical mechanical polishing (CMP) process, the silicon nitride hard mask has an unsatisfactory blocking effect, which often results in damage to oxide and the silicon nitride. In addition, due to the limitation of a "chamfering" height in CMP of a buffer oxide layer (Buffer OX), the thickness of the silicon nitride hard mask cannot be infinitely increased.

Figure 3:
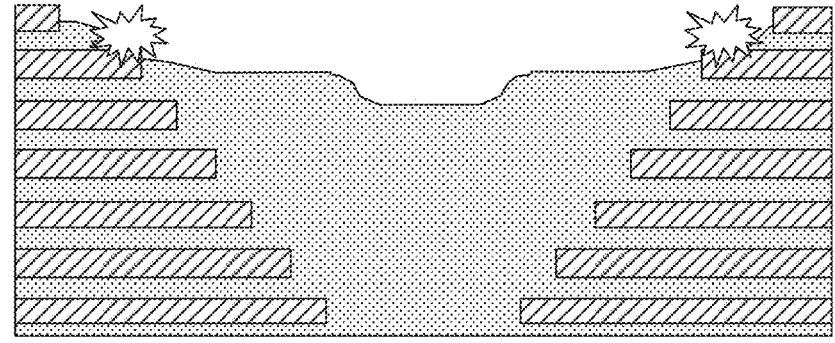
FIG. 3 and FIG. 4 illustrate schematic diagrams of a semiconductor device.
Figure 4:
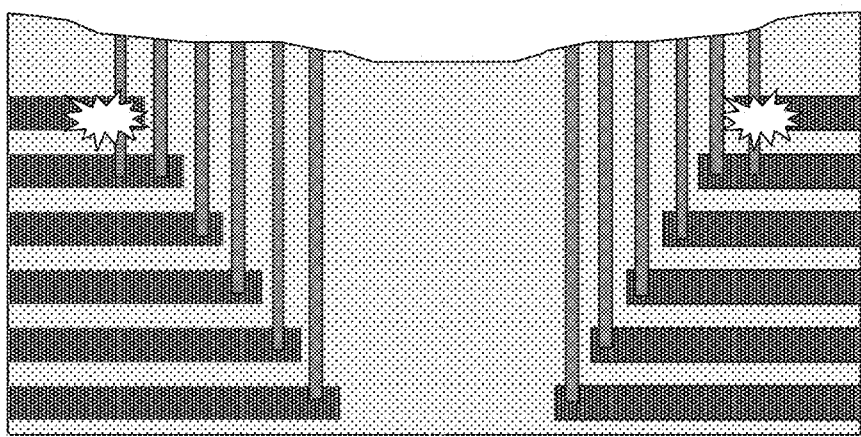

FIG. 3 and FIG. 4 illustrate schematic diagrams of a semiconductor device. Referring to FIG. 3 and FIG. 4, a semiconductor structure formed using the above method is clearly overpolished at an edge of a GB region. In addition, a connection window for a contact structure of this semiconductor structure is relatively small. In this case, during the etching of the contact structure, an upper stair/step tends to be overetched, leading to punch through. As a result, process requirements cannot be met, and product yield is reduced.

For the foregoing problems, the following embodiments of the disclosure provide a method for manufacturing a semiconductor device. The manufacturing method increases a connection window for a contact structure, thereby effectively avoiding overpolishing at an edge of the GB region.

The method for manufacturing a semiconductor device according to the disclosure includes the following operations. A semiconductor structure including a stacked structure is provided. The stacked structure includes first material layers and second material layers that are alternatively stacked. The stacked structure includes a giant block (GB) region and a stair-step region adjacent to the GB region. Second material layers are provided at the top of the GB region and the top of the stair-step regions, respectively. A third material layer covering an upper surface of the GB region and a surface of the stair-step region is formed. A fourth material layer filling the stair-step region and covering the GB region is formed. Part of the third material layer and part of the fourth material layer on the GB region are removed, while retaining the third material layer and the fourth material layer on the GB region close to an edge of the stair-step region. First planarization is performed to remove a protruding part of the fourth material layer, and stops at the second material layer and the third material layer on the upper surface of the GB region.

Figure 5:
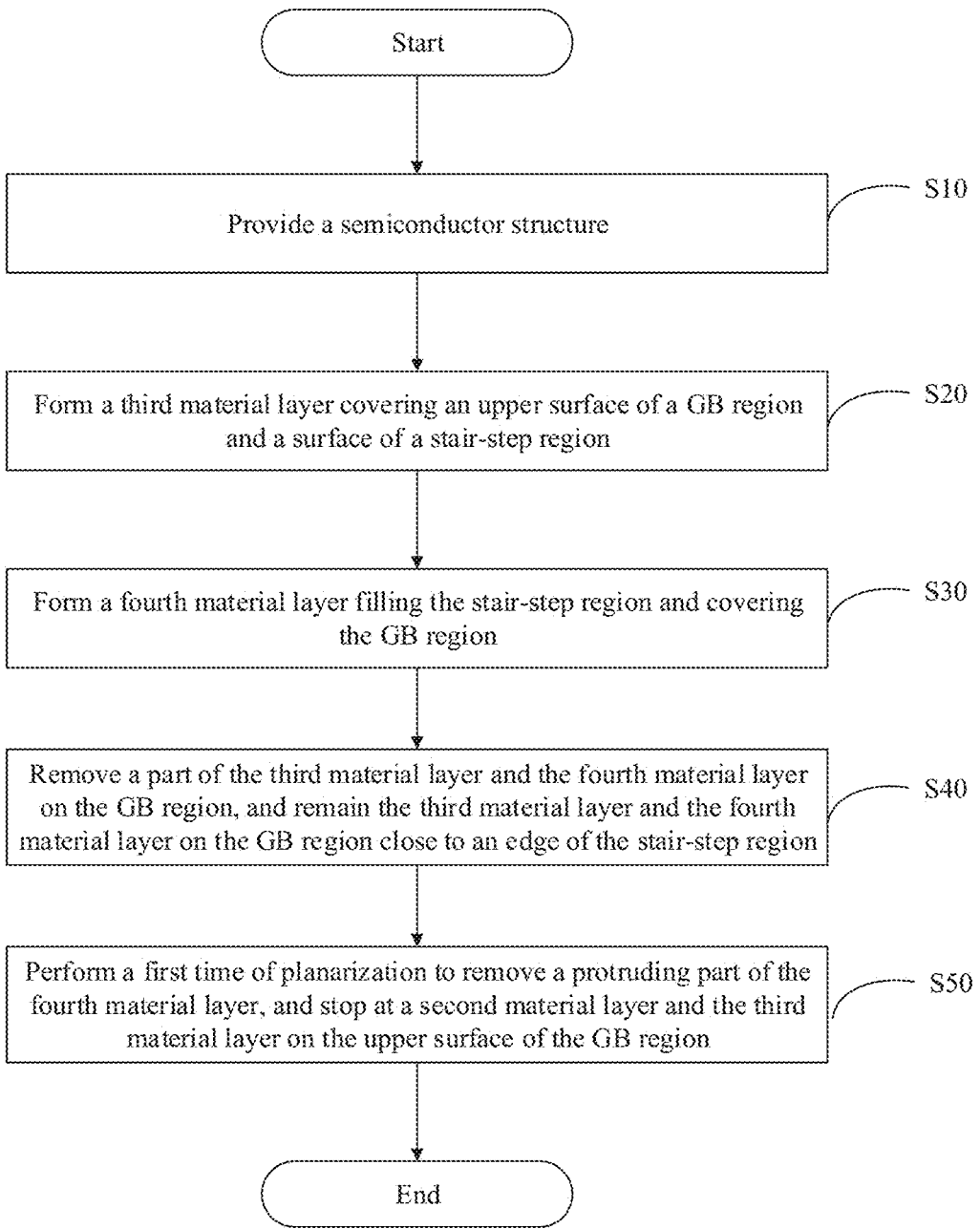
FIG. 5 illustrates a flowchart of a method for manufacturing a semiconductor device according to embodiments of the disclosure.

FIG. 5 illustrates a flowchart of a method for manufacturing a semiconductor device according to embodiments of the disclosure. FIGS. 6 to 15 illustrate schematic diagrams of process operations of a method for manufacturing a semiconductor device according to embodiments of the disclosure. The manufacturing method is described below with reference to FIGS. 5 to 15.

The description given below is merely exemplary and variations may be made by those skilled in the art without departing from the spirit of the disclosure.

In S10, a semiconductor structure is provided.

Figure 7:
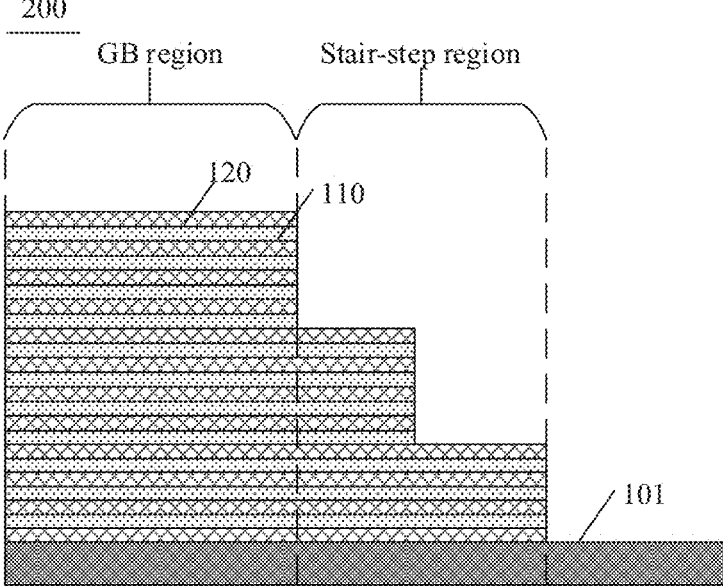

Referring to FIG. 7, a semiconductor structure 200 is provided. The semiconductor structure 200 includes a stacked structure. The stacked structure includes first material layers 110 and second material layers 120 that are alternatively stacked. The stacked structure includes a GB region and a stair-step region adjacent to the GB region. Second material layers 120 are provided at the top of the GB region and the top of the stair-step region respectively. The GB region may be used for storage, and the stair-step region may be used for electrical connection.

In some embodiments of the disclosure, the first material layers 110 include dielectric layers, and the second material layers 120 may be pseudo gate layers.

The material of the first material layers 110 may be, for example, silicon dioxide, aluminum oxide, hafnium oxide, tantalum oxide, or the like. The material of the second material layers 120 may be, for example, silicon nitride or silicon oxynitride (SiOxNx).

A deposition method for forming the first material layers 110 and the second material layers 120 may include: chemical vapor deposition (CVD, plasma enhanced CVD (PECVD), low-pressure CVD (LPCVD), or high-density plasma CVD (HDPCVD)), atomic layer deposition (ALD), or physical vapor deposition methods such as molecular beam epitaxy (MBE), thermal oxidation, evaporation, or sputtering.

In some embodiments of the disclosure, after a multilayer stacked structure of a SiOx-SiOxNx-SiOx stack (ONO stack) is formed, the second material layers 120 (pseudo gate layers) in the stacked structure may be replaced to obtain gate layers. A replacement method includes, but not limited to, wet etching. A replacement material may be a conductive material such as tungsten, cobalt, nickel, or titanium, or may be polycrystalline silicon, doped silicon, or any combination thereof.

In some examples, the first material layers 110 have an etch selectivity different from that of the second material layers 120. For example, the first material layers and the second material layers may be a combination of silicon nitride and silicon dioxide, a combination of silicon dioxide with undoped polycrystalline silicon or amorphous silicon, a combination of silicon dioxide or silicon nitride with amorphous carbon or the like. For example, after the second material layers 120 (the pseudo gate layers) of silicon nitride or silicon oxynitride are formed, the second material layers 120 may be replaced with tungsten in a subsequent process operation. However, the disclosure is not limited thereto.

Continuing to refer to FIG. 7, in some embodiments, the semiconductor structure 200 further includes a substrate 101 under the stacked structure.

The material of the substrate 101 may be silicon (Si), germanium (Ge), silicon germanide (SiGe), Silicon on Insulator (SOI), Germanium on Insulator (GOI), or the like. The substrate 101 may further include another element or compound such as GaAs, InP, SiC, or the like. The substrate 101 may also be a stack structure, for example, Si/SiGe or the like, or may include another epitaxial structure, for example, Silicon Germanium on Insulator (SGOI), or the like. The disclosure is not limited thereto.

Figure 6:
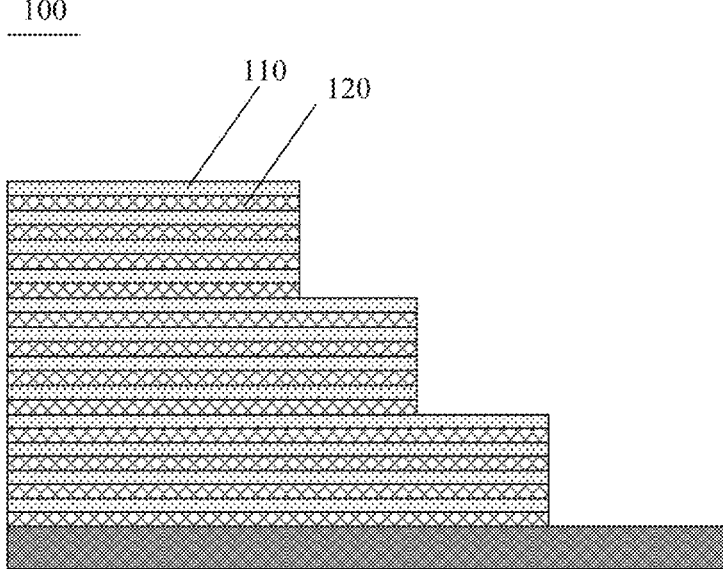
FIGS. 6 to 15 illustrate schematic diagrams of process operations of a method for manufacturing a semiconductor device according to embodiments of the disclosure.

Referring to FIG. 6, a semiconductor structure 100 similarly includes a stacked structure. The stacked structure includes first material layers 110 and second material layers 120 that are alternately stacked. The stacked structure includes a GB region and a stair-step region adjacent to the GB region. Different from the semiconductor structure 200 illustrated in FIG. 7, semiconductor structure 100 has first material layers 110 at the top of the GB region and the top of the stair-step region.

In some embodiments, dry etching may be performed on the semiconductor structure 100 as illustrated in FIG. 6 to remove the first material layers 110 at the top of the GB region and the top of the stair-step region of the semiconductor structure 100 to expose the second material layers 120 below respectively, thereby obtaining the semiconductor structure 200 illustrated in FIG. 7. However, the disclosure is not limited thereto.

In S20, a third material layer covering an upper surface of the GB region and an upper surface of the stair-step region is formed.

Figure 9:
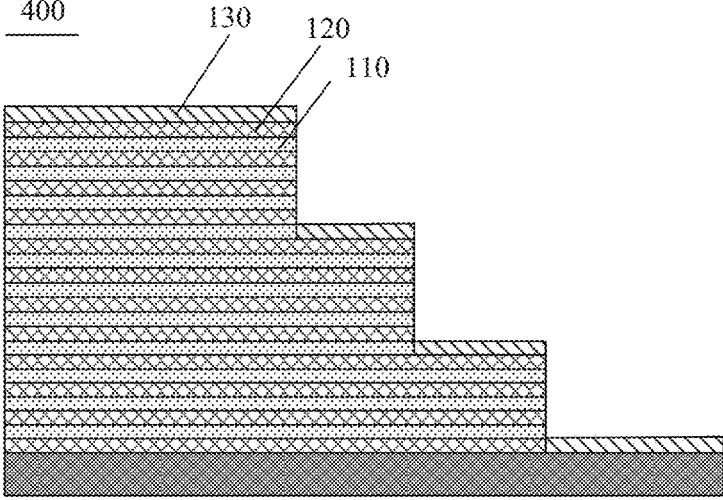

Referring to FIG. 9, a third material layer 130 covering an upper surface of the GB region and an upper surface of the stair-step region is formed.

In some embodiments, the third material layer 130 may be formed through deposition on the upper surface of the GB region and the upper surface of the stair-step region of the semiconductor structure 200 illustrated in FIG. 7.

In some embodiments of the disclosure, a material of the third material layer 130 includes one or more of silicon oxynitride, aluminum oxide, and titanium nitride.

In some embodiments, the material of the third material layer 130 is silicon oxynitride (SiOxNy, for example, SiON).

A deposition method for forming the third material layer 130 may include chemical vapor deposition (CVD, PECVD, LPCVD, or HDPCVD), ALD, or physical vapor deposition methods such as MBE, thermal oxidation, evaporation, or sputtering.

Figure 8:
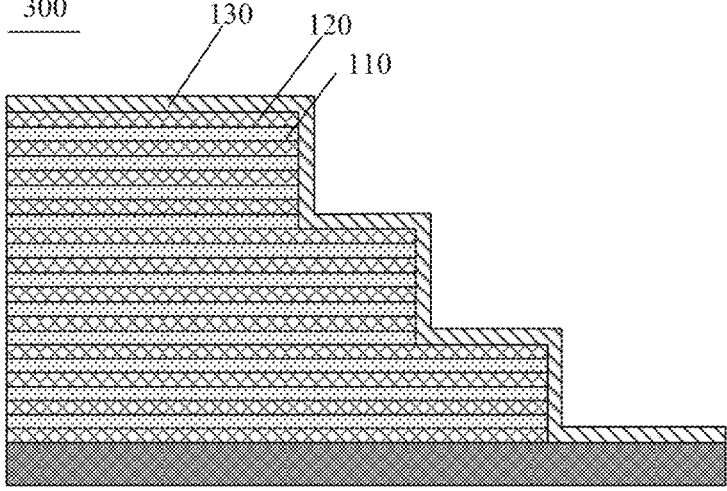

Referring to FIG. 8 and FIG. 9, in some embodiments of the disclosure, a method for forming a third material layer 130 covering an upper surface of the GB region and an upper surface of the stair-step region includes: forming the third material layer 130 covering the upper surface of the GB region and the upper surface and a sidewall of the stair-step region (a semiconductor structure 300); and then removing the third material layer 130 covering the sidewall of the stair-step region to form a semiconductor structure 400.

In some embodiments, a dry etching process may be used to remove the third material layer 130 covering the sidewall of the stair-step region in the semiconductor structure 300 directionally by controlling a gas direction.

In S30, a fourth material layer filling the stair-step region and covering the GB region is formed.

Figure 10:
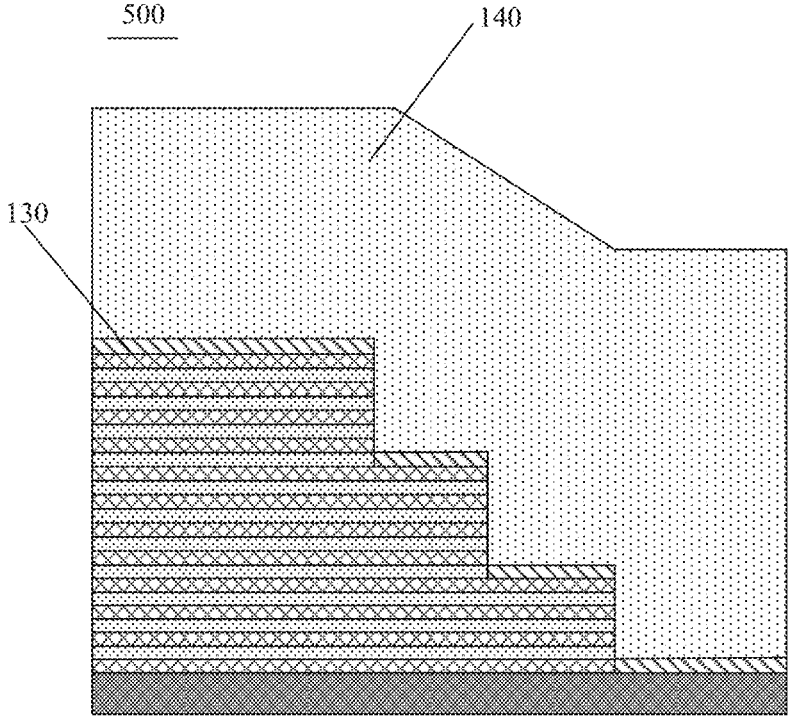

Referring to FIG. 10, a fourth material layer 140 filling the stair-step region and covering the GB region is formed. For example, the fourth material layer 140 may be deposited onto the GB region and the stair-step region, to enable the fourth material layer 140 on the stair-step region to be higher than the upper surface of the GB region, to form a semiconductor structure 500.

In some embodiments of the disclosure, a material of the fourth material layer 140 includes silicon dioxide.

In some embodiments, tetraethyl orthosilicate (TEOS)-derived silicon dioxide can be deposited using methods such as CVD, PECVD, or LPCVD.

In S40, part of the third material layer and part of the fourth material layer on the GB region are removed, while retaining the third material layer and the fourth material layer on the GB region close to an edge of the stair-step region.

Figure 11:
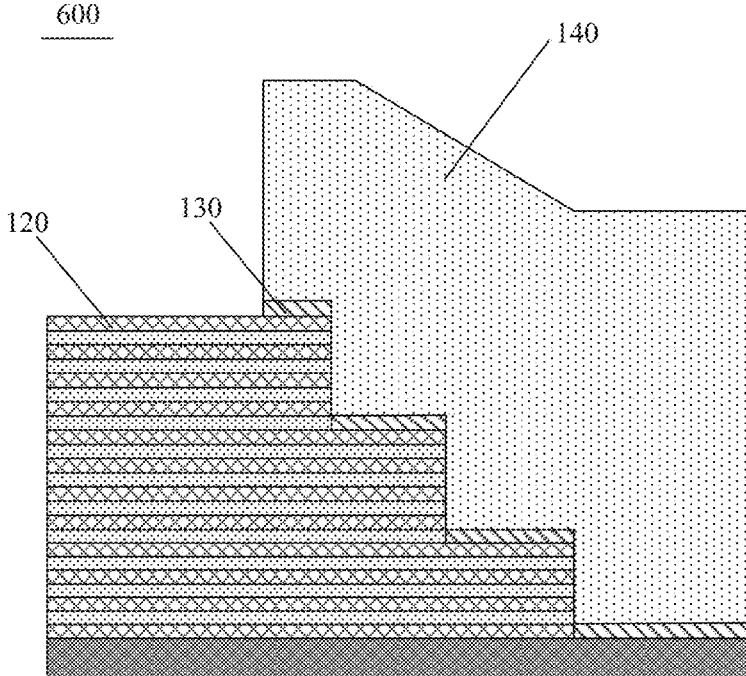

Referring to FIG. 10 and FIG. 11, part of the third material layer 130 and part of the fourth material layer 140 on the GB region of the semiconductor structure 500 are removed, while retaining the third material layer 130 and the fourth material layer 140 on the GB region close to the edge of the stair-step region, to form a semiconductor structure 600.

In an example illustrated in FIG. 11, not only the third material layer 130 and the fourth material layer 140 on the GB region close to the edge of the stair-step region are retained, but also a part of the third material layer 130 on the GB region away from the stair-step region is retained. In some other examples, the third material layer 130 and the fourth material layer 140 on the GB region close to the edge of the stair-step region may be retained only. The disclosure is not limited thereto.

A method for removing the third material layer 130 and the fourth material layer 140 includes, but is not limited to, dry etching. The dry etching mainly uses reaction gas and plasma to etch a material to be etched.

In some embodiments, a photoresist (PR) may be applied on an upper surface of the fourth material layer 140. The PR is patterned using a photolithography process to form a mask pattern. Next, the mask pattern is used as a mask to etch the third material layer 130 and the fourth material layer 140 below the mask.

In operation S50, first planarization is performed to remove a protruding part of the fourth material layer and stops at the second material layer and the third material layer on the upper surface of the GB region.

Figure 12:
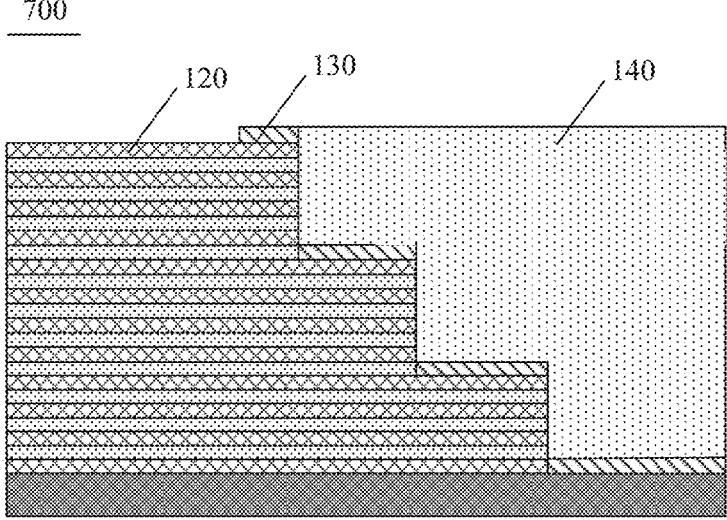

Referring to FIG. 12, the first planarization is performed. In the first planarization, the protruding part of the fourth material layer 140 may be removed, and the first planarization may stop at the second material layer 120 and the third material layer 130 on the upper surface of the GB region to form a semiconductor structure 700.

In some embodiments of the disclosure, in the first planarization, the third material layer 130 on the upper surface of the GB region away from the edge of the stair-step region is removed, and a part of the third material layer 130 on the GB region close to the stair-step region is also removed.

The first planarization stops at the second material layer 120 and the third material layer 130 on the upper surface of the GB region to retain at least a part of the third material layer 130 at the upper surface of the GB region close to the stair-step region.

It should be understood that in this operation, the planarization is mainly performed to remove the protruding part of the fourth material layer 140. During the planarization, the third material layer 130 on the upper surface of the GB region away from the edge of the stair-step region and a part of the second material layer 120 below same may also be removed at the same time. Alternatively, a part of the third material layer 130 on the GB region close to the edge of the stair-step region may also be removed at the same time.

In some embodiments of the disclosure, the first planarization is performed using CMP, and the polishing selection ratio of the fourth material layer 140 to the third material layer 130 is greater than 10.

A CMP process is a technology that combines chemical and mechanical actions and can obtain a planar surface free of scratches and contaminant stains.

After this operation, at least a part of the third material layer 130 on the GB region close to the edge of the stair-step region is retained, thereby effectively avoiding overpolishing at the edge of the GB region during the planarization.

In some embodiments of the disclosure, after operation S50, the method further includes: removing the third material layer on the upper surface of the GB region; removing the second material layer at the top of the GB region to expose a corresponding first material layer; and performing second planarization. In the second planarization, a partial thickness of the fourth material layer on the stair-step region is removed, and the second planarization stops at the first material layer at the top of the GB region.

Figure 13:
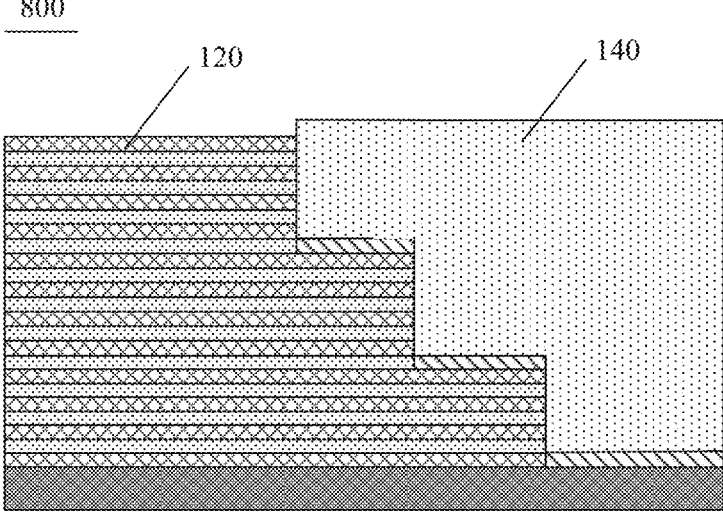

Referring to FIG. 12 and FIG. 13, the third material layer 130 on the upper surface of the GB region is removed to form a semiconductor structure 800.

In some embodiments of the disclosure, the third material layer 130 on the upper surface of the GB region may be removed through dry etching, and an etch selection ratio of the third material layer 130 to the corresponding first material layer 110 and/or to the second material layer 120 at the top of the GB region is greater than 10.

Figure 14:
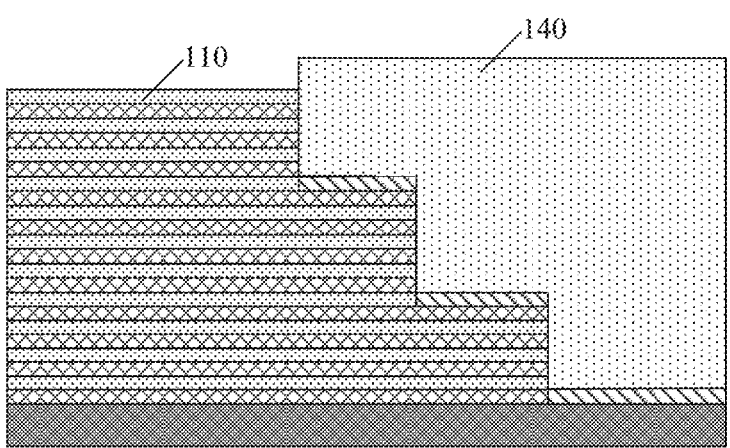

Referring to FIG. 13 and FIG. 14, the second material layer 120 at the top of the GB region is removed to expose a corresponding first material layer 110 to form a semiconductor structure 900.

In some embodiments, the second material layer 120 at the top of the GB region may be removed through wet etching to expose the first material layer 110 below the second material layer 120.

After the foregoing operations, a "chamfer" with a relatively large height difference is formed at the edge of the GB region close to the stair-step region.

Figure 15:
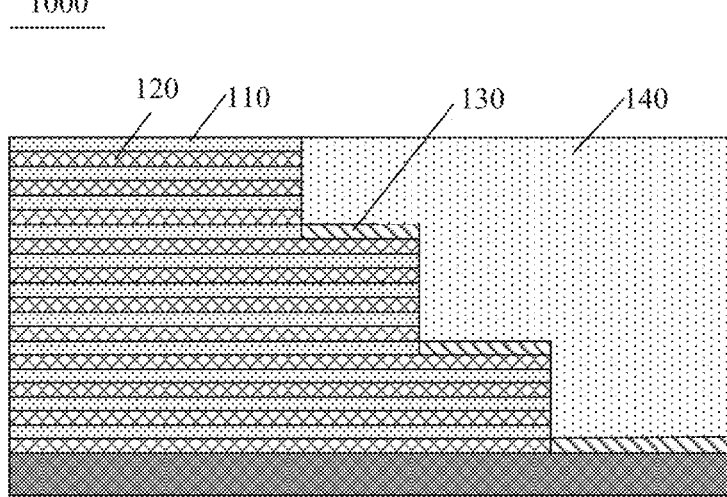

Referring to FIG. 14 and FIG. 15, second planarization is performed to remove a partial thickness of the fourth material layer 140 on the stair-step region and stops at the first material layer 110 at the top of the GB region to form a semiconductor structure 1000.

In some embodiments of the disclosure, in the second planarization, a part of the first material layer 110 at the top of the GB region may also be removed at the same time.

When the material of the first material layer 110 and the fourth material layer 140 are both silicon dioxide, the polishing selection ratio between the two is relatively small. The previously formed "chamfer" may be repaired by partially overpolishing the first material layer 110 at the top of the GB region, to make the upper surface of the GB region of the semiconductor structure 1000 flush with the upper surface of the fourth material layer 140 on the stair-step region.

Figure 16:
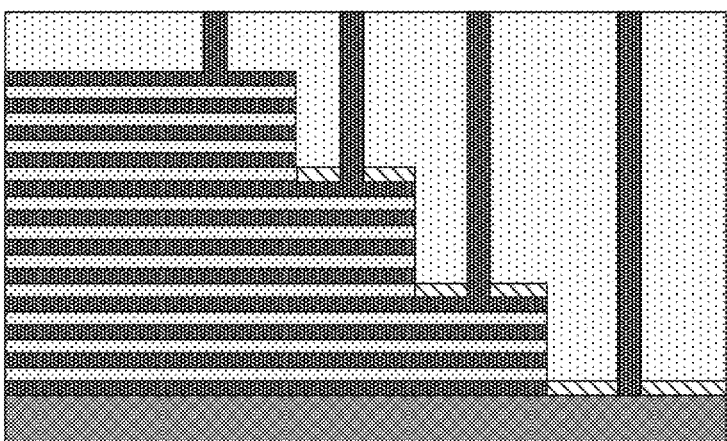
FIG. 16 illustrates a schematic diagram of a semiconductor device according to embodiments of the disclosure.

FIG. 16 illustrates a schematic diagram of a semiconductor device according to embodiments of the disclosure. Referring to FIG. 16, after the semiconductor structure 1000 is formed, the connection of contact structures may further be performed, so that the contact structures may be connected to respective second material layers 120 (for example, gate layers) in the GB region.

In the method for manufacturing a semiconductor device according to the disclosure, because the third material layer 130 is retained as a stop layer on each stair step of the stair-step region, the third material layer 130 and the second material layer 120 play a double-layer stop effect. A connection window for a contact structure is effectively enlarged, thus avoiding a punch through in an upper stair step during contact structure etching, thereby increasing the product yield.

The flowchart in FIG. 5 is used to describe the actions/operations performed in the manufacturing method according to embodiments of the disclosure. It should be understood that these actions/operations are not necessarily performed in exact order. Instead, various actions/operations can be processed in reverse order or simultaneously. In addition, other actions/actions may be added to these processes or one or more of the actions/operations may be removed.

Those skilled in the art may make appropriate adjustments to the order of priority of the specific operations of the manufacturing method according to practical needs, and the disclosure is not limited thereto.

The foregoing embodiments of the disclosure provide a method for manufacturing a semiconductor device. The manufacturing method enlarges a connection window for a contact structure, thereby effectively avoiding overpolishing at an edge of the GB region.

Another aspect of the disclosure provides a semiconductor device having high reliability.

The semiconductor device of the disclosure includes a substrate. The semiconductor device includes a stacked structure on the substrate, and the stacked structure includes first material layers and gate layers that are alternately stacked. The stacked structure includes a GB region and a stair-step region. The semiconductor device includes a third material layer covering an upper surface of the stair-step region; and at least one contact structure in the stair-step region. Each of the at least one contact structure penetrates the third material layer and is connected with a respective one of the gate layers.

Referring to FIG. 15, the semiconductor device (for example, the semiconductor structure 1000) includes a stacked structure. The stacked structure includes first material layers 110 and second material layers 120 that are alternately stacked. The stacked structure includes a GB region and a stair-step region adjacent to the GB region. One of the first material layers 110 is provided at the top of the GB region. One of the second material layers 120 is provided at the top of the stair-step region. The semiconductor device (for example, the semiconductor structure 1000) further includes a third material layer 130 covering an upper surface of the stair-step region, and a fourth material layer 140 filling the stair-step region. The upper surface of the GB region is flush with the upper surface of the fourth material layer 140.

In some embodiments of the disclosure, the semiconductor device (for example, the semiconductor structure 1000) further includes a substrate 101 under the stacked structure.

In some embodiments of the disclosure, the first material layers 110 include dielectric layers, and the second material layers 120 may be pseudo gate layers.

In some embodiments, the material of the first material layers 110 may be, for example, silicon dioxide, aluminum oxide, hafnium oxide, tantalum oxide, or the like. The material of the second material layers 120 may be, for example, silicon nitride or silicon oxynitride (SiOxNx).

In some embodiments of the disclosure, the material of the third material layer 130 includes one or more of silicon oxynitride, aluminum oxide, and titanium nitride.

In some embodiments of the disclosure, the material of the fourth material layer 140 includes silicon dioxide.

In manufacturing the semiconductor device according to the disclosure, because the third material layer 130 is retained as a stop layer on each stair step of the stair-step region, the third material layer 130 and the second material layer 120 play a double-layer stop effect. A connection window for a contact structure is effectively enlarged, thus avoiding a punch through in an upper stair step during contact structure etching, thereby increasing the product yield.

It should be noted that the semiconductor device of the disclosure may be, for example, implemented using the method for manufacturing a semiconductor device in FIG. 5. However, the disclosure is not limited thereto.

For other implementation details of the semiconductor device in this embodiment, reference may be made to the embodiments described in FIG. 5 to FIG. 16. Details are not described again herein.

The foregoing embodiments of the disclosure provide a semiconductor device. The reliability of the semiconductor device is relatively high.

It will be appreciated that while some embodiments of the disclosure currently considered useful are discussed in the above disclosure by way of various examples, it should be understood that these details serve only illustrative purposes and that the appended claims are not limited to the disclosed embodiments; rather, the claims are intended to cover any combination of all amendments and equivalents consistent with the substance and scope of embodiments of the disclosure.

The basic concepts have been described above, and the above disclosure is intended as an example only and does not constitute a limitation to the disclosure to those skilled in the art. Although not expressly stated herein, those skilled in the art may make various modifications, improvements, and amendments to the disclosure. Such modifications, improvements, and amendments are suggested in the disclosure, so such modifications, improvements, and amendments still fall within the spirit and scope of the exemplary embodiments of the disclosure.

In addition, the disclosure uses specific words to describe embodiments of the disclosure. For example, "one embodiment," "an embodiment," and/or "some embodiments" means a feature, structure, or characteristic associated with at least one embodiment of the disclosure. Therefore, it should be emphasized and noted that "an embodiment," "one embodiment," or "an alternative embodiment" mentioned twice or more in different places in this specification does not necessarily refer to the same embodiment. In addition, certain features, structures, or characteristics in one or more embodiments of the disclosure may be suitably combined.

In addition, unless expressly stated in the claims, the disclosure deals with the order of elements and sequences, the use of numbers and letters, or the use of other names, and is not intended to limit the order of the procedures and methods of the disclosure. While some embodiments of the disclosure currently considered useful are discussed in the above disclosure by way of various examples, it should be understood that such details serve only illustrative purposes and that the additional claims are not limited to the disclosed embodiments; rather, the claims are intended to cover a combination of all amendments and equivalents consistent with the substance and scope of embodiments of the disclosure. For example, while the system components described above can be implemented through hardware devices, they can also be implemented through software-only solutions, such as installing the described system on an existing server or mobile device.

Similarly, it should be noted that in order to simplify the presentation of the disclosure and thereby aid in the understanding of one or more embodiments of the disclosure, the preceding descriptions of embodiments of the disclosure sometimes group a plurality of features into one embodiment, accompanying drawing or description thereof. However, such a manner of disclosure does not imply that the subject of the disclosure requires more features than those mentioned in the claims. In fact, the features of the embodiments are fewer than all of the features of the individual embodiments disclosed above.

Some embodiments use numbers describing the number of components and the number of attributes, and it should be understood that such numbers used in the description of the embodiments are modified in some examples by the modifier "approximate," "approximately," or "substantially".

Unless otherwise noted, "approximate," "approximately," or "substantially" indicate that ±20% variation is allowed in the figures. Accordingly, in some embodiments, the numerical parameters used in the specification and claims are approximations, and the approximations can change depending on the desired characteristics of individual embodiments. In some embodiments, the numerical parameters should take into account the specified number of valid digits and use the general rounding-off method. Although the numerical fields and parameters used to confirm the breadth of their ranges in some embodiments of the disclosure are approximate values, in specific embodiments, such values are set as precisely as possible in a practicable range.

Although the disclosure has been described with reference to the embodiments, a person of ordinary skill in the art should recognize that the above embodiments are used only to describe the disclosure, and various equivalent variations or substitutions may be made without departing from the spirit of the disclosure. Therefore, variations and variants of the above embodiments shall fall within the scope of the claims of the disclosure as long as they are within the substantial spirit of the disclosure.

The invention claimed is:

1. A semiconductor structure, comprising:
a substrate;
a stacked structure on the substrate, wherein the stacked structure comprises first material layers and gate layers that are alternatively stacked, and comprises a giant block (GB) region and a stair-step region;
a third material layer, arranged in discrete portions each at a vertical level, covering an upper surface of the stair-step region; and
at least one contact structure in the stair-step region, wherein each of the at least one contact structure penetrates a corresponding discrete portion of the third material layer and is connected with a respective one of the gate layers.

2. The semiconductor structure according to claim 1, further comprising:
a fourth material layer on the third material layer and covering the stair-step region.

3. The semiconductor structure according to claim 2, wherein:
the at least one contact structure further penetrates the fourth material layer.

4. The semiconductor structure according to claim 1, wherein:
the at least one contact structure is filled with a conductive material, and the gate layers are formed of a same material as the conductive material.

5. The semiconductor structure according to claim 1, wherein:
the stair-step region comprises a plurality of stair steps; and
the plurality of stair steps sequentially descend as getting farther away from the GB region.

6. The semiconductor structure according to claim 1, wherein:
the third material layer further covers a part of the substrate beyond the stair-step region.

7. The semiconductor structure according to claim 1, wherein:
the third material layer comprises silicon oxynitride.

8. The semiconductor structure according to claim 1, wherein:
the third material layer comprises aluminum oxide or titanium nitride.

9. The semiconductor structure according to claim 1, wherein:
an upper surface of the GB region is one of the first material layers.

10. The semiconductor structure according to claim 1, wherein:
the third material layer is disposed in the stair-step region, without extending to the GB region.

11. The semiconductor structure according to claim 1, wherein:
the third material layer is absent from sidewalls of the stacked structure in a plurality of stair steps of the stair-step region.

12. The semiconductor structure according to claim 1, wherein:
the third material layer is configured to surround part of sidewalls of the at least one contact structure at an end of the at least one contact structure.

13. The semiconductor structure according to claim 1, wherein:
each discrete portion corresponds to a first material layer of the stacked structure at a same vertical level.

14. The semiconductor structure according to claim 1, wherein:
a bottom surface of a contact structure of the at least one contact structure is higher than or flush with a bottom surface of a corresponding gate layer that is in contact with the contact structure.

15. The semiconductor structure according to claim 1, wherein:
the third material layer is discontinuous at sidewalls of the stacked structure in a plurality of stair steps of the stair-step region.

16. A semiconductor structure, comprising:
a stacked structure comprising interleaved first material layers and gate layers in a giant block (GB) region and a stair-step region;
a third material layer, arranged in discrete portions each at a vertical level, covering an upper surface of the stair-step region; and
at least one contact structure in the stair-step region each penetrating a corresponding discrete portion of the third material layer to contact a corresponding gate layer below the corresponding discrete portion,
wherein the third material layer is discontinuous at sidewalls of the stacked structure in a plurality of stair steps of the stair-step region.

17. The semiconductor structure according to claim 16, wherein:
the third material layer is disposed in the stair-step region, without extending to the GB region.

18. The semiconductor structure according to claim 16, wherein:
one discrete portion of the third material layer at a stair step of the plurality of stair steps remains approximately at a same vertical level.

19. The semiconductor structure according to claim 16, wherein:
the third material layer is configured to surround part of sidewalls of the at least one contact structure at an end of the at least one contact structure.

20. The semiconductor structure according to claim 16, wherein:
one discrete portion of the third material layer at a stair step of the plurality of stair steps is arranged on and in direct contact with a corresponding gate layer below the discrete portion.

* * * * *